(12) United States Patent
Chen et al.

(10) Patent No.: US 6,394,175 B1
(45) Date of Patent: May 28, 2002

(54) TOP MOUNTED COOLING DEVICE USING HEAT PIPES

(75) Inventors: Shiaw-Jong S. Chen, Plano; Roger J. Hooey, Rockwall, both of TX (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/483,041

(22) Filed: Jan. 13, 2000

(51) Int. Cl.[7] .................................................. F28F 7/00
(52) U.S. Cl. ............................... 165/80.3; 165/104.33; 165/121; 361/697; 361/700; 257/715; 257/722
(58) Field of Search ......................... 165/80.3, 104.26, 165/104.33, 185, 121–125; 361/700, 697; 257/715, 722

(56) References Cited

U.S. PATENT DOCUMENTS

| | | | | |
|---|---|---|---|---|
| 3,739,234 A | * | 6/1973 | Bylund et al. | 165/104.33 X |
| 5,535,816 A | * | 7/1996 | Ishida | 165/104.11 X |
| 5,690,468 A | * | 11/1997 | Hong | 165/80.3 X |
| 5,729,995 A | * | 3/1998 | Tajima | 165/104.33 X |
| 5,835,350 A | | 11/1998 | Stevens | 361/704 |
| 5,896,917 A | * | 4/1999 | Lemont et al. | 165/18 |
| 5,949,648 A | * | 9/1999 | Liao | 165/104.33 X |
| 5,959,837 A | * | 9/1999 | Yu | 165/104.33 X |
| 5,960,865 A | * | 10/1999 | Costa et al. | 165/80.3 X |
| 6,041,850 A | * | 3/2000 | Esser et al. | 165/104.33 X |
| 6,043,980 A | * | 3/2000 | Katsui | 165/80.3 X |
| 6,102,110 A | * | 8/2000 | Julien et al. | 165/104.33 X |
| 6,104,611 A | * | 8/2000 | Glover et al. | 165/104.33 X |
| 6,105,662 A | * | 8/2000 | Suzuki | 165/104.33 |
| 6,320,746 B2 | * | 11/2001 | Pei et al. | 361/700 |
| 6,343,643 B1 | * | 2/2002 | Bollesen | 165/104.33 |
| 6,352,104 B1 | * | 3/2002 | Mok | 165/104.33 |

FOREIGN PATENT DOCUMENTS

| | | | | |
|---|---|---|---|---|
| DE | 1174338 | * | 7/1964 | 165/104.33 |
| JP | 0113354 | * | 10/1978 | 165/104.33 |
| JP | 401110033 | * | 4/1989 | 165/104.33 |

OTHER PUBLICATIONS

U.S. Patent Application Serial No. 09/482,839 filed on Jan. 13, 2000 entitled "Integrated Active Cooling Device for Board Mounted Electronic Components" by Shiaw–Jong S. Chen, et al.

* cited by examiner

Primary Examiner—Christopher Atkinson
(74) Attorney, Agent, or Firm—Hitt, Gaines & Boisbrun

(57) ABSTRACT

The present invention provides an integrated cooling device employing heat pipes for cooling an electronic component and a method of manufacturing the same. In one embodiment, the integrated cooling device includes a plate couplable to and supportable by the electronic component. The plate has at least one channel therein that presents an enhanced surface area. The cooling device further includes a sealed heat pipe having a heat-receiving portion fitted within the channel such that the enhanced surface area in contact with the heat pipe experiences an increased thermal communication between the plate and the heat pipe. The heat pipe also has a heat-removing portion that is distal from the heat receiving portion. Inside the heat pipe, a fluid, initially located in the heat-receiving portion of the heat pipe as a liquid, receives heat and evaporates to form a vapor that travels to the heat-removing portion. In the heat-removing portion of the heat pipe, the vapor condenses and cycles back o the heat-receiving portion.

21 Claims, 2 Drawing Sheets

TOP MOUNTED COOLING DEVICE USING HEAT PIPES

TECHNICAL FIELD OF THE INVENTION

The present invention is directed, in general, to a cooling device for electronic components and, more specifically, to a cooling device that uses heat pipes and is employable as a top mounted cooling device for board mounted electronic components and circuits.

BACKGROUND OF THE INVENTION

Pity the poor circuit designer of today. He or she can design magnificent circuits that can do more in less space than his or her predecessor ever, in their wildest dreams, thought possible. Yet circuit designers are still faced with some of the same problems that confounded designers at a time when vacuum tubes were the latest technology. One such problem is the control of temperature in the electronics device before it builds to a level where component and circuit damage can occur.

In fact, this age old problem is even more perplexing to contemporary circuit designers than it was to their predecessors. Today's circuit designers can make wonderfully small devices, yet must dedicate an enormous amount of real estate in the device to heat control devices. In the older vacuum tube electronics device, the functional electronic components took so much space and the cabinet or chassis housing the device was so large, that the space occupied by heat control devices was hardly noticeable. This is not the case today, where heat control considerations have come to occupy a preeminent position in circuit design.

Heat control becomes a most perplexing problem to contemporary circuit designers when they must package their design for commercial use. Because circuits are designed to accomplish more tasks in a more efficient manner, they have become increasingly complex. This increased complexity means the total number of components to be housed in a case or cabinet designed to accommodate the circuit is also increased. The task has become even more difficult and complex with the increased pressure to produce the smaller, more compact devices demanded by customers.

In certain electronic devices, such as power supplies, the amount of heat generated by the circuit components is significant. Unless such heat is controlled, temperatures will build to a level where significant component damage will occur, followed by the failure of the electronics device itself. Such considerations frequently force circuit designers to package an electronic device based upon heat control considerations, instead of functional operational considerations.

Heat is usually controlled in an electronics device by dissipating it into the ambient air before temperatures rise to a level that damage can occur. The traditional method to contain temperature build-up within acceptable limits is to associate the significant heat generating components with heat dissipation devices, such as finned heat sinks. In certain cases, the most efficient use of a finned heat sink is to mount the heat generating component directly on the heat sink. This provides for a more efficient conduction of heat from the component to the fins of the heat sink, where the heat is dissipated into the ambient air.

A finned heat sink is strictly a passive heat dissipation device, the efficiency of which is determined by its material and design. The use of passive finned heat sink devices has generally been successful, but at a cost. The cost is the additional weight added to the electronic device by using a number of heat sinks and the space required by such heat sinks. These factors militate against using passive heat sinks for smaller, more compact electronic devices that generate significant heat.

As more complex, compact electronic systems have evolved, electronic device designers have turned to other heat control methods in order to remain competitive. On method that has met with some success is the use of active, rather than passive, systems to control temperature. Certain board mounted electronic components that generate large amounts of heat, such as power components, may generally have a dedicated active cooling device, such as a small fan, mounted on them. A small fan used in this manner provides more efficient cooling in less space than a classic finned heat sink used to cool the same component. When a fan is combined with a finned heat sink, even more cooling efficiency is realized.

Notwithstanding the benefits associated with using active cooling devices in combination with passive cooling devices, a need exists for even more aggressive temperature control devices and methods. This is because customer demand continues to grow for even more complex and compact electronic devices. Such complex devices can be furnished, but they will have an even larger number electronic components that require cooling in order to prevent temperature related damage.

Accordingly, what is needed in the art is an improved heat control device that can be used to efficiently control temperature build-up from heat generating electronic components and electronic circuits.

SUMMARY OF THE INVENTION

To address the above-discussed deficiencies of the prior art, the present invention provides an integrated cooling device employing heat pipes for cooling an electronic component and a method of manufacturing the same. In one embodiment, the cooling device includes a plate couplable to and supportable by the electronic component. The plate has at least one channel therein that presents an enhanced surface area. The cooling device further includes a sealed heat pipe with a heat-receiving portion fitted within the channel such that the enhanced surface area in contact with the heat pipe experiences an increased thermal communication between the plate and the heat pipe. The heat pipe also has a heat-removing portion that is distal from the heat-receiving portion. Inside the heat pipe, a fluid, initially located in the heat-receiving portion of the heat pipe as a liquid, receives heat and evaporates to form a vapor that travel to the heat-removing portion. In the heat-removing portion of the heat pipe, the vapor condenses and cycles back to the heat-receiving portion.

Another embodiment of the invention provides for a cooling device employing heat pipes for cooling a integrated circuit. This embodiment provides for a plate with a footprint based on a footprint of the integrated circuit to be cooled. The plate is couplable to and supportable by the integrated circuit and has at least one channel with the heat-receiving portion of a sealed heat pipe therein.

The present invention, in broad scope, therefore introduces the broad concept of a cooling device that employs heat pipes. The cooling device can be used as a top mounted device to cool a heat generating electronic component or an integrated circuit. The invention provides an enhanced area for a heat-receiving portion of a heat pipe to gather heat from the electronic component or the integrated circuit. The collected heat evaporates a fluid in the pipe and changes its state from liquid to vapor. The vapor migrates to a heat-removing portion of the heat-pipe that is distal from the heat-receiving portion, wherein the vapor condenses to return to a liquid state. The liquid then flows back to its original position in the heat-receiving portion of the heat pipe where the cycle starts again.

In one embodiment of the present invention, the heat pipe approximates the shape of a U. The U-shape heat pipe is located on its side with the heat-receiving portion disposed in the channel in the plate coupled to the electronic component or circuit. A particularly beneficial embodiment provide for the integrated cooling device to have a plurality of channels in the plate with a plurality of sealed heat pipes disposed therein. A particularly useful aspect of this embodiment provides for the cooling device to have five sealed heat pipes disposed in five channels.

Another embodiment of the invention provides for the plate of the cooling device to be the base of a heat sink having a plurality of cooling fins. Another aspect of this embodiment provides for a cooling fan couplable to the heat sink. These embodiments, when employed with the heat pipes, present the opportunity to form an integrated top mounted cooling device.

Still another embodiment of the invention provides for the cooling device to further include a support cooling fin that can be coupled to the heat-removing portion of the heat pipe to provide both support for the heat-removing portion and additional heat dissipation. Another aspect of this embodiment provides for a plurality of the support cooling fins to be couplable to the heat-removing portion of the heat pipe.

The present invention also provides a method of manufacturing an integrated cooling device for use in cooling an electronic component. The method, in one embodiment, comprises forming at least one channel in a plate couplable to and supportable by the electronic component. In this embodiment, sealed heat pipe is disposed in the at least one channel with a heat-receiving portion of the heat pipe in thermal communication with the plate and a heat-removing portion of the heat pipe distal from the heat receiving portion.

The foregoing has outlined, rather broadly, preferred and alternative features of the present invention so that those skilled in the art may better understand the detailed description of the invention that follows. Additional feature of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
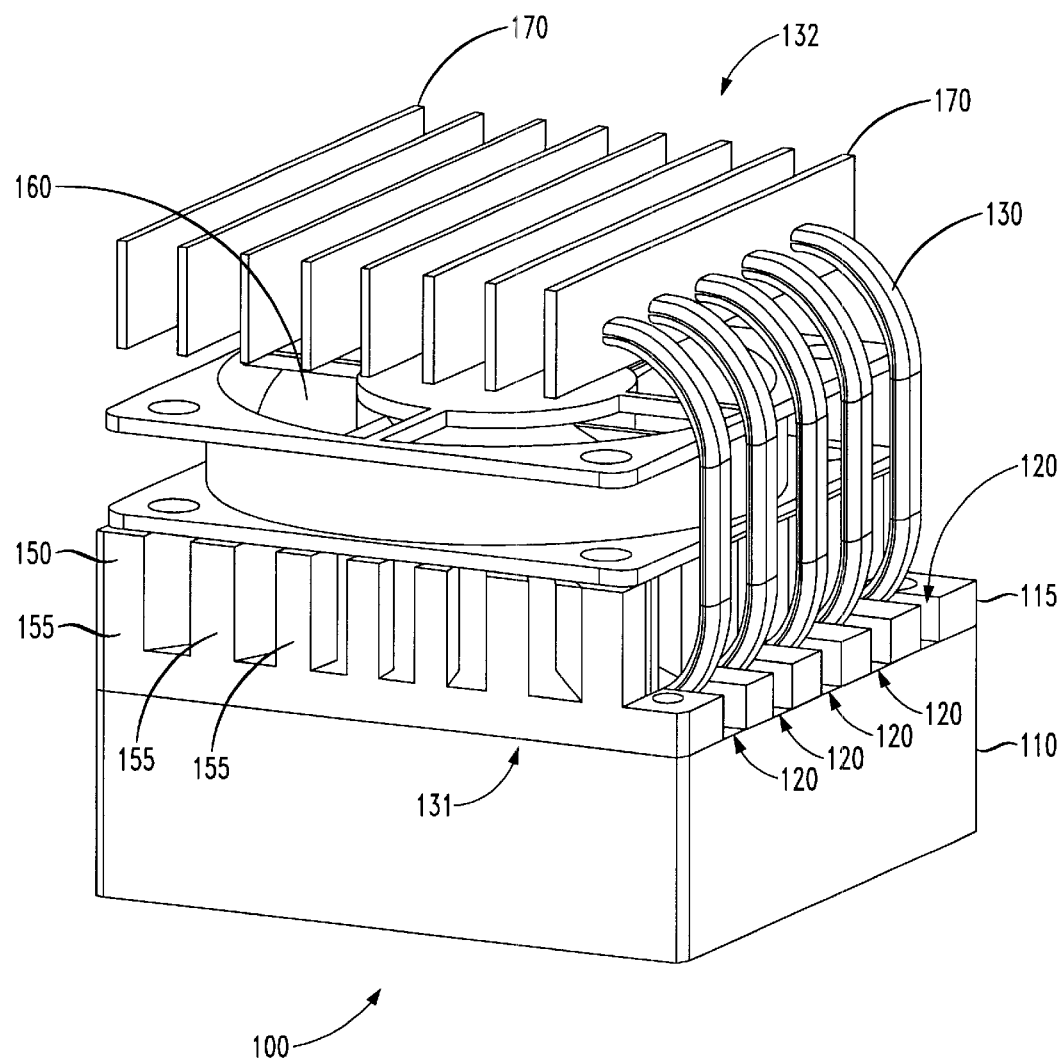
FIG. 1 illustrates an isometric view of an embodiment of an integrated cooling device constructed in accordance with the principles of the present invention.

Referring initially to FIG. 1, illustrated is an isometric view of an embodiment of an integrate cooling device 100, constructed in accordance with the principles of the present invention. The integrated cooling device 100 is top-mounted on an electronic component 110. The cooling device 100 includes a plate 115 that is coupled to and supported by the electronic component 110. The plate 115 has at least one channel 120 located therein. In the illustrated embodiment, the plate 115 has a series of five channels 120. Each channel 120 in the plate 115 has one end of a sealed heat pipe 130 fitted into it. The end of the sealed heat pipe 130 fitted into the channel 120 is the heat-receiving portion 131 (not visible).

The electronic component 110 may be a heat generating component such as an integrated circuit (e.g., a microprocessor). Alternatively, the electronic component 110 may be an electronic module, such as a power supply module (e.g., a board mounted power supply), that contains a number of heat generating components (e.g., power MOSFETs) therein. For more information on power supply modules, refer to U.S. Pat. No. 5,835,350 to David L. Stevens, which is herein incorporated by reference.

Figure 2A:
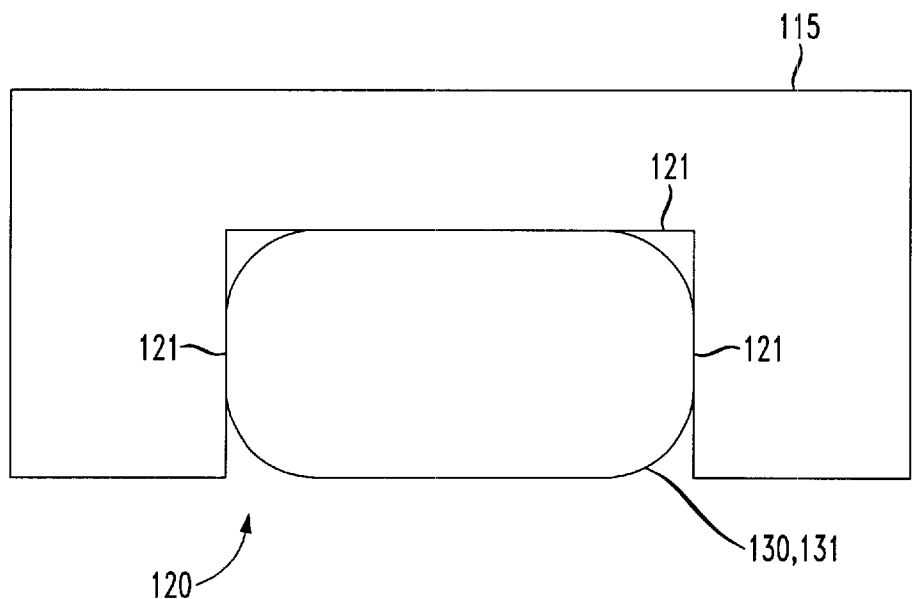
FIG. 2A illustrates a cross sectional view of one channel in the plate with a heat-receiving portion of a heat pipe fitted therein.

Turning now to FIG. 2A, illustrated is a cross sectional view of one channel 120 in the plate 115 with the heat-receiving portion 131 of the heat pipe 130 fitted therein. The channel 120 is formed in the plate 115 and has several sides 121 that are in contact with the heat pipe 130. This channel 120 configuration presents an enhanced surface area that contacts the heat-receiving portion 131 of the heat pipe 130 to increase thermal communication between the heat pipe 130 and the plate 115. This increased thermal communication improves the heat transfer rate between the plate 115 and the heat-receiving portion 131 of the heat pipe 130.

Figure 2B:
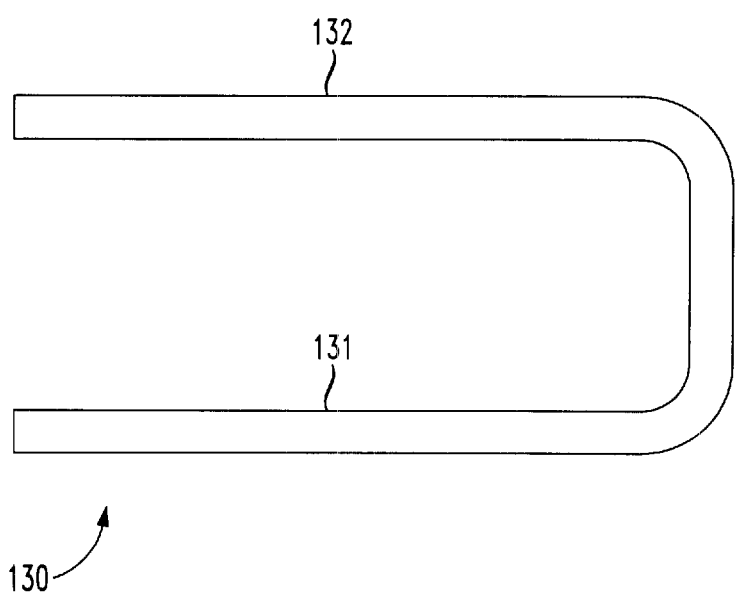
FIG. 2B illustrates a side view of a sealed heat pipe with a heat-receiving portion and, distal to the heat receiving portion, a heat radiating portion.

Turning now to FIG. 2B, illustrated is a side view of the heat pipe 130. The heat pipe 130 has a heat-removing portion 132 distal to the heat-receiving portion 131. The heat-receiving portion 131 is fitted into the channel 120 illustrated in FIG. 1. The sealed heat pipe 130 is hollow and has a fluid (not illustrated) located inside it. The fluid is in a liquid state until it is heated and changes to a vapor state. Those skilled in the pertinent art are familiar with sealed heat pipes. For more information on heat pipes, refer to An Introduction to Heat Pipes: Modeling, Testing, and Applications, by G. P. Pertersen, published by John Wiley & Sons, 1994; and Heat Pipe Science and Technology: Basic Formulation and Linear Problems, by Amir Faghri, published by Taylor & Francis, 1995, which are herein incorporated by reference.

By referring to FIGS. 1, 2A and 2B, the operation of one embodiment of the invention can now be explained. As heat is generated by the electronic component 110, the heat is conducted by the plate 115 to the heat-receiving portion 131 of the heat pipe 130. Because of the construction of the channel 120, an enhanced surface area is provided to conduct heat to the heat-receiving portion 131 of the heat pipe 130 that is fitted into the channel. The fluid in the heat pipe 130 is heated until it changes state from liquid to vapor. The hot vapor the travels to the heat-removing portion 132 of the heat pipe 130 where the heat is dissipated into the surrounding ambient air. The loss of heat causes the vapor to condense back to a liquid state. The liquid cycles back to the heat-receiving portion 131 of the heat pipe 130, and the cycle is repeated.

The heat pipe 130 illustrated in FIG. 2B and the plurality of heat pipes 130 illustrated in FIG. 1 all have a shape that approximates the letter U. In FIG. 1, each heat pipe 130 is located so that one side, the heat-receiving portion 131, of the U is fitted into a channel 120 on the plate 115. The other side of the U, the heat-removing portion 132 of the heat pipe 130, bends back over the top of the electronic component 110 being cooled. Of course, the heat pipe 130 need not be U-shaped, but may assume other shapes and still be well within the broad scope of the present invention.

In the illustrated embodiment, the integrated cooling device 100 includes a finned heat sink 150 that has a plurality of cooling fins 155. The base of the finned heat sink 150 is the plate 115 that is coupled to the electronic component 110. Those skilled in the pertinent art will readily recognize that the heat sink 150 and plate 115 can be separate parts.

The integrated cooling device 100 further includes a cooling fan 160 that is coupled to the heat sink 150. Those of skilled in the pertinent art will also understand that the cooling fan 160 could be nested in the plurality of cooling fins 155 on the heat sink 150 and still be within the intended scope of the invention. The cooling fan 160 is particularly beneficial because it moves ambient air through the fins 155 and over the heat-removing portions 132 of the heat pipes 130. The cooling fan 160, combined with the heat sink 150 and heat pipes 130, provide a particularly beneficial embodiment of the invention.

Also illustrated in FIG. 1 are support cooling fins 170 coupled to the heat pipes 130. The support cooling fins 170 provide additional supporting structure to he heat pipes 130, as well as additional cooling surface to convect and radiate heat into the surrounding ambient air.

The integrated cooling device 100 described herein may be employed to cool electronic components such as an integrated circuit or a modular power supply. Such integrated circuits are frequently manufactured in modular form. The integrated cooling device may be adapted to operate with a variety of heat-generating devices and components.

The invention also includes a method of manufacturing an integrated cooling device 100. The description of the device and the various embodiments of the invention set forth herein is sufficient to enable a person skilled in the pertinent art to manufacture the integrated cooling device 100.

As previously noted, the various embodiments of a cooling device 100 described herein can be combined into an integrated cooling device 100. The construction of integrated cooling devices is described in detail in U.S. patent application Ser. No. 09/482,839, entitled, INTEGRATED ACTIVE LIQUID COOLING DEVICE FOR BOARD MOUNTED ELECTRONIC COMPONENTS, to Chen, et al., commonly assigned with the invention and incorporated herein by reference.

Although the present invention has bee described in detail, those skilled in the art should understand that they can make various changes, substitutions and alterations herein without departing from the spirit and scope of the invention in its broadest form.

What is claimed is:

1. For use in cooling an electronic component, an integrated cooling device, comprising:
   a heat sink having a plate couplable to and supportable by said electronic component, said plate having at least one channel therein that presents an enhanced surface area;
   a sealed and substantially U-shaped heat pipe having a heat-receiving portion fitted within said at least one channel to cause said enhanced surface area to contact said heat pipe to increase thermal communication between said plate and said heat pipe, said heat pipe further having a heat-removing portion distal from said heat receiving portion;
   a cooling fan coupled to and supported by said heat sink and interposed between said heat receiving portion and said heat-removing portion of said heat pipe; and
   a fluid, initially located in said heat-receiving portion as a liquid, configured to receive heat via said enhanced surface area, evaporate to form a vapor, travel to said heat-removing portion, condense in said heat-removing portion and cycle back to said heat-receiving portion.

2. The integrated cooling device as recited in claim 1 wherein said heat pipe is located on one side with said heat-receiving portion disposed in said at least one channel.

3. The integrated cooling device as recited in claim 1 further comprising a plurality of channels in said plate and a plurality of sealed heat pipes disposed in said plurality of channels.

4. The integrated cooling device S recited in claim 3 wherein five sealed heat pipes are dispose in said channels.

5. The integrated cooling device as recited in claim 1 wherein said heat sink has a plurality of cooling fins.

6. The integrated cooling device a recited in claim 1 further comprising a support cooling fin couplable to and supporting said heat-removing portion of said heat pipe.

7. The integrated cooling device a recited in claim 6 wherein a plurality of said support cooling fins are couplable to and support said heat-removing portion of said heat pipe.

8. A method of manufacturing an integrated cooling device for use in cooling an electronic component, comprising:
   forming at least one channel in a plate of a heat sink couplable to and supportable by said electronic component;
   coupling a cooling fan to said heat sink to support said cooling fan; and
   disposing a sealed and substantially U-shaped heat pipe having a fluid enclosed therein in said at least one channel with a heat-receiving portion of said heat pipe in thermal communication with said plate and a heat-removing portion of said heat pipe distal from said heat-receiving portion, wherein said cooling fan is interposed between said heat-receiving portion and said heat-receiving portion.

9. The method of manufacturing as recited in claim 8 wherein said heat pipe is disposed on its side with said heat-receiving portion disposed in said at least one channel.

10. The method of manufacturing as recited in claim 8 further comprising forming a plurality of channels in said plate and disposing a plurality of sealed heat pipes in said channels.

11. The method of manufacturing as recited in claim 10 wherein five sealed heat pipes are disposed in said channels.

12. The method of manufacturing as recited in claim 9 wherein said heat sink has a plurality of cooling fins.

13. The method of manufacturing as recited in claim 8 further comprising forming a support cooling fin and coupling said support cooling fin to support said heat-removing portion of said heat pipe.

14. The method of manufacturing as recited in claim 13 further comprising forming a plurality of said support cooling fins.

15. For use in cooling an integrated circuit, an integrated cooling device, comprising:
   a heat sink including a plate having a footprint based on a footprint of said integrated circuit and couplable to and supportable by said integrated circuit, said plate having at least one channel therein;

a sealed and substantially U-shaped heat pipe having a heat-receiving portion disposed in said at least one channel to place said heat-receiving portion in thermal communication with said plate, said heat pipe further having a heat-removing portion distal from said heat receiving portion;

a cooling fan coupled to and supported by said heat sink and interposed between said heat-receiving portion and said heat-removing portion of said heat pipe; and a fluid disposed in said heat pipe, said fluid in a liquid state located in said heat-receiving portion and heated by said integrated circuit evaporating to form a vapor and traveling to said heat-removing portion, said vapor located in said heat-removing portion condensing and cycling back to said heat-receiving portion.

16. The integrated cooling device as recited in claim 15 wherein said heat pipe is placed on its side with said heat-receiving portion disposed in said at least one channel.

17. The integrated cooling device as recited in claim 15 further comprising a plurality of channels in said plate and a plurality of sealed heat pipes disposed in said channels.

18. The integrated cooling device as recited in claim 17 wherein five sealed heat pipes are disposed in said channels.

19. The integrated cooling device as recited in claim 17 wherein said heat sink has a plurality of cooling fins.

20. The integrated cooling device as recited in claim 15 further comprising a support cooling fin coupled to and supporting said heat-removing portion of said heat pipe.

21. The integrated cooling device as recited in claim 20 wherein a plurality of said support cooling fins are coupled to and supporting said heat-removing portion of said heat pipe.

* * * * *